United States Patent
Hou et al.

(10) Patent No.: US 10,367,114 B2
(45) Date of Patent: Jul. 30, 2019

(54) BIOLOGICAL DETECTION DEVICE AND PROCESSING METHOD OF THE SAME

(71) Applicant: Shenzhen Goodix Technology Co., Ltd., Shenzhen (CN)

(72) Inventors: Lyu Hou, Shenzhen (CN); Shengbin Zhang, Shenzhen (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 42 days.

(21) Appl. No.: 15/610,618

(22) Filed: May 31, 2017

(65) Prior Publication Data

US 2017/0271546 A1    Sep. 21, 2017

Related U.S. Application Data

(63) Continuation of application No. PCT/CN2016/089440, filed on Jul. 8, 2016.

(30) Foreign Application Priority Data

Jan. 14, 2016 (CN) .......................... 2016 1 0027073

(51) Int. Cl.
| | |
|---|---|
| H01L 27/146 | (2006.01) |
| H01L 31/16 | (2006.01) |
| G06K 9/00 | (2006.01) |
| H01L 31/02 | (2006.01) |
| H01L 31/0232 | (2014.01) |
| G06K 9/20 | (2006.01) |

(52) U.S. Cl.
CPC ............ *H01L 31/16* (2013.01); *G06K 9/0004* (2013.01); *G06K 9/0012* (2013.01); *G06K 9/00013* (2013.01); *G06K 9/00053* (2013.01); *G06K 9/2018* (2013.01); *H01L 27/14678* (2013.01); *H01L 27/14685* (2013.01); *H01L 31/02002* (2013.01); *H01L 31/02327* (2013.01)

(58) Field of Classification Search
None
See application file for complete search history.

(56) References Cited

U.S. PATENT DOCUMENTS

| 7,214,953 B2 | 5/2007 | Setlak et al. |
| 7,321,701 B2 | 1/2008 | Setlak et al. |

(Continued)

FOREIGN PATENT DOCUMENTS

| CN | 1875370 A | 12/2006 |
| CN | 104050445 A | 9/2014 |

(Continued)

OTHER PUBLICATIONS

International Search Report for International Application No. PCT/CN2016/089440, Applicant: Shenzhen Huiding Technology Co., Ltd., dated Oct. 25, 2016, 5 pages.

*Primary Examiner* — Cheung Lee

(57) ABSTRACT

The present disclosure provides a biological detection device and a processing method of the same. The biological detection device comprises a chip, a light emitter, a circuit board and a covering layer. The chip comprises a photoelectric converter, and the covering layer is covered on the chip, the photoelectric converter and the light emitter; the covering layer is light transmissive; the light emitter emits light; the photoelectric converter receives the light emitted by the light emitter, and is further used for performing photoelectric converting on the light so as to obtain an electrical signal; the chip detects an object to be detected according to the electrical signal; and the circuit board provides a communication channel and power supply for the chip and the light emitter. The technical solution of the present disclosure can improve flexibility of using the biological detection device, and prevent fingerprint recognition from being cracked by prosthesis.

20 Claims, 8 Drawing Sheets

(56) References Cited

U.S. PATENT DOCUMENTS

| | | |
|---|---|---|
| 7,351,974 B2 | 4/2008 | Setlak |
| 7,358,514 B2 | 4/2008 | Setlak et al. |
| 7,358,515 B2 | 4/2008 | Setlak et al. |
| 7,361,919 B2 | 4/2008 | Setlak |
| 7,433,729 B2 | 10/2008 | Setlak et al. |
| 7,671,351 B2 | 3/2010 | Setlak et al. |
| 7,915,601 B2 | 3/2011 | Setlak et al. |
| 8,391,569 B2 | 3/2013 | Wu |
| 2005/0063571 A1 | 3/2005 | Setlak et al. |
| 2005/0063572 A1 | 3/2005 | Setlak et al. |
| 2005/0063573 A1 | 3/2005 | Setlak et al. |
| 2005/0069180 A1 | 3/2005 | Setlak et al. |
| 2005/0069181 A1 | 3/2005 | Setlak et al. |
| 2005/0089202 A1 | 4/2005 | Setlak et al. |
| 2005/0089203 A1 | 4/2005 | Setlak |
| 2006/0008128 A1 | 1/2006 | Setlak et al. |
| 2006/0062439 A1 | 3/2006 | Setlak |
| 2010/0007632 A1* | 1/2010 | Yamazaki ............. G06F 1/1616 345/175 |
| 2010/0208952 A1 | 8/2010 | Wu |
| 2012/0161697 A1* | 6/2012 | Park ........................ G06F 1/263 320/108 |
| 2015/0146944 A1* | 5/2015 | Pi ........................ H04L 63/0861 382/124 |

FOREIGN PATENT DOCUMENTS

| | | |
|---|---|---|
| CN | 104239869 A | 12/2014 |
| CN | 104616001 A | 5/2015 |
| CN | 105117697 A | 12/2015 |
| EP | 2472436 A1 | 7/2012 |
| WO | 2015/077733 A1 | 5/2015 |

* cited by examiner

BIOLOGICAL DETECTION DEVICE AND PROCESSING METHOD OF THE SAME

CROSS-REFERENCE TO RELATED APPLICATIONS

This application is a continuation of International Application No. PCT/CN2016/089440, filed on Jul. 8, 2016, which claims priority to Chinese Patent Application No. 201610027073.9, filed on Jan. 14, 2016, both of which are hereby incorporated by reference in their entireties.

TECHNICAL FIELD

The present disclosure relates to the field of biological detection, and in particular, to a biological detection device and a processing method of the same.

BACKGROUND

In the prior art, a fingerprint recognition module for fingerprint recognition and an optical module for performing heart rate detection, living body detection or press detection on a biological body are separate devices, which results in inconvenience for a user to carry and low flexibility to use, and the fingerprint recognition module being easily cracked by prosthesis.

SUMMARY

The present disclosure provides a biological detection device and a processing method of the biological detection device, which enables the biological detection device not only recognizes a fingerprint, but also detects other features of a biological body, thereby improving portability for a user and flexibility of using the biological detection device, and meanwhile preventing fingerprint recognition from being cracked by prosthesis.

According to a first aspect, a biological detection device is provided. The biological detection device comprises: a chip, a light emitter, a circuit board and a covering layer; the chip comprises a photoelectric converter, the covering layer is covered on the chip, the photoelectric converter and the light emitter; the covering layer is passed through by light emitted by the light emitter; the photoelectric converter receives light reflected by an object to be detected through the covering layer, wherein the light is emitted by the light emitter and irradiates the object to be detected through the covering layer; the photoelectric converter performs photoelectric converting on the light emitted by the light emitter, irradiating an object to be detected and then reflected through the covering layer again to obtain an electrical signal; the chip for fingerprint detection detects the object to be detected according to the electrical signal converted by the photoelectric converter; and the circuit board provides a communication channel and power supply for the chip, the light emitter and the photoelectric converter.

With reference to the first aspect, in a first possible implementation, the light emitter is integrated on the chip.

With reference to the first aspect or the first possible implementation, in a second possible implementation, the covering layer comprises a protection layer and a color layer, and the adhesive force between the protection layer and the color layer is greater than or equal to 3 B; the light transmittance of the protection layer to the light emitted by the light emitter is greater than or equal to 30%, and is used for protecting the color layer; and the light transmittance of all or part of the color layer to the light emitted by the light emitter is greater than or equal to 30%, the thickness of the color layer ranges between 5 nm and 50 μm, the permittivity of the color layer is greater than 2, and the color layer is used for providing the appearance color of the biological detection device.

With reference to the second possible implementation, in a third possible implementation, the protection layer is a cover plate, and the material of the cover plate is glass, sapphire, ceramic, acrylic or plastic cement. At this time, the covering layer is connected on the chip, the photoelectric converter and the light emitter through glue or a thin film, the thickness of the glue ranges between 5 μm and 150 μm, the permittivity of the glue is within 1 to 10, and the light transmittance of the glue is greater than and equal to 90%.

With reference to the second possible implementation, in a fourth possible implementation, the protection layer is a hardness layer, the thickness of the hardness layer ranges between 2 μm and 25 μm, the Mohs hardness of the hardness layer is greater than or equal to 3, and the permittivity of the hardness layer is within 1 to 10. At this time, the color layer is attached to the chip, the photoelectric converter and the light emitter in a manner of spraying, the adhesive force between the color layer and the chip, the photoelectric converter and the light emitter is greater than or equal to 3 B, and the hardness layer is attached to the color layer in a manner of spraying.

With reference to any of the second to the fourth possible implementation, in a fifth possible implementation, the light emitter emits at least one of infrared light and red light. Accordingly, the color layer comprises at least one layer of infrared ray (IR) oil ink, and the light transmittance of each layer of the IR oil ink to the light emitted by the light emitter is greater than or equal to 30%.

With reference to any of the second to the fourth possible implementation, in a sixth possible implementation, the light emitter emits at least one of infrared light and red light. At this time, the color layer comprises at least one layer of IR oil ink and at least one layer of conventional oil ink, the light transmittance of each layer of the IR oil ink to the light emitted by the light emitter is greater than or equal to 30%, and pores are opened at a partial position of the at least one layer of conventional oil ink. Accordingly, the photoelectric converter is specifically used for receiving the light emitted by the light emitter, irradiating an object to be detected through the at least one layer of IR oil ink and the pore portion on the at least one layer of conventional oil ink as well as the protection layer and then reflected through the protection layer and the pore portion on the at least one layer of conventional oil ink as well as the at least one layer of IR oil ink again.

With reference to the first aspect or the first possible implementation, in a seventh possible implementation, the covering layer comprises a thin film, and the light transmittance of all or part of the thin film to the light emitted by the light emitter is greater than or equal to 30%.

With reference to the first aspect or any of the above possible implementations, in an eighth possible implementation, the chip is soldered on the circuit board through solder paste or silver paste using plane soldering technology, and the thickness of the solder paste or silver paste between the chip and the circuit board ranges between 20 μm and 120 μm.

With reference to the first aspect or any of the above possible implementations, in a ninth possible implementation, the biological detection device further comprises a ring, the ring is soldered on the circuit board through solder paste or silver paste using plane soldering technology, and the thickness of the solder paste or silver paste between the ring and the circuit board ranges between 40 μm and 140 μm; and the ring surrounds the chip, the light emitter and the photoelectric converter.

With reference to the first aspect or any of the above possible implementations, in a tenth possible implementation, the chip performs fingerprint detection, heart rate detection, pressure detection, key press detection, blood oxygen detection, blood pressure detection and/or living body detection on the object to be detected according to the electrical signal.

The biological detection device of the present disclosure integrates an optical module for performing detection on a biological body and a device for fingerprint recognition together, such that the biological detection device not only recognizes a fingerprint, but also detects other features of the biological body, that is, one detection device is capable of completing multiple functions, thereby improving portability for a user and flexibility of using the biological detection device, and meanwhile preventing fingerprint recognition from being cracked by prosthesis.

According to a second aspect, a processing method of a biological detection device is provided. The biological detection device comprises a chip, a light emitter, a circuit board and a covering layer. The covering layer is configured to be passed through by light emitted by the light emitter; the photoelectric converter is configured to receive the light emitted by the light emitter, irradiating an object to be detected through the covering layer and then reflected through the covering layer again; the photoelectric converter is further configured to perform photoelectric converting on the reflected light so as to obtain an electrical signal; the chip is configured to detect the object to be detected according to the electrical signal; and the circuit board is configured to provide a communication channel and power supply for the chip, the light emitter and the photoelectric converter. The processing method comprises: integrating the photoelectric converter on the chip; fixing the chip on the circuit board; and the covering layer being covered on the chip, the photoelectric converter and the light emitter.

With reference to the second aspect, in a first possible implementation, the processing method further comprises integrating the light emitter on the chip.

With reference to the second aspect or the first possible implementation, in a second possible implementation, the specific implementation of the covering layer being covered on the chip, the photoelectric converter and the light emitter comprises: silk screening or spraying oil ink on a cover plate so that the oil ink forms a color layer, the color layer and the cover plate forming the covering layer, wherein the adhesive force between the color layer and the cover plate is greater than or equal to 3 B; the material of the cover plate is glass, sapphire, ceramic, acrylic or plastic cement; the light transmittance of the cover plate to the light emitted by the light emitter is greater than or equal to 30%; the light transmittance of all or part of the color layer to the light emitted by the light emitter is greater than or equal to 30%, the thickness of the color layer ranges between 5 nm and 50 μm, and the permittivity of the color layer is greater than 2. At this time, the covering layer is connected on the chip, the photoelectric converter and the light emitter through glue or a thin film, the thickness of the glue ranges between 5 μm and 150 μm, the permittivity of the glue is within 1 to 10, and the light transmittance of the glue is greater than and equal to 90%.

With reference to the second aspect or the first possible implementation, in a third possible implementation, the specific implementation of the covering layer being covered on the chip, the photoelectric converter and the light emitter comprises: silk screening or spraying oil ink on the chip, the photoelectric converter and the light emitter, the oil ink forming a color layer, wherein the adhesive force between the color layer and the chip, the photoelectric converter and the light emitter is greater than or equal to 3 B, the light transmittance of all or part of the color layer to the light emitted by the light emitter is greater than or equal to 30%, the thickness of the color layer ranges between 5 nm and 50 μm, and the permittivity of the color layer is greater than 2; and silk screening a hardness layer on the color layer, wherein the adhesive force between the color layer and the hardness layer is greater than or equal to 3 B, the thickness of the hardness layer ranges between 2 μm and 25 μm, the Mohs hardness of the hardness layer is greater than or equal to 3, and the permittivity of the hardness layer is within 1 to 10.

With reference to the second possible implementation, in a fourth possible implementation, the light emitter is used for emitting infrared light, wherein the specific implementation of the silk screening or spraying oil ink on the cover plate comprises: silk screening or spraying at least one layer of infrared ray (IR) oil ink on the cover plate; or silk screening or spraying at least one layer of infrared ray (IR) oil ink and at least one layer of conventional oil ink on the cover plate, and opening pores at a partial position of the at least one layer of conventional oil ink.

With reference to the second possible implementation, in a fifth possible implementation, the light emitter is used for emitting infrared light and red light, wherein the specific implementation of the silk screening or spraying oil ink on the cover plate comprises: silk screening or spraying at least one layer of conventional oil ink on the cover plate; and opening pores at a partial position of the at least one layer of conventional oil ink.

With reference to the third possible implementation, in a sixth possible implementation, the light emitter is used for emitting infrared light, wherein the specific implementation of the silk screening or spraying oil ink on the chip, the photoelectric converter and the light emitter comprises: silk screening or spraying at least one layer of infrared ray (IR) oil ink on the chip, the photoelectric converter and the light emitter; or silk screening or spraying at least one layer of infrared ray (IR) oil ink and at least one layer of conventional oil ink on the chip, the photoelectric converter and the light emitter, and opening pores at a partial position of the at least one layer of conventional oil ink.

With reference to the third possible implementation, in a seventh possible implementation, the light emitter is used for emitting infrared light and red light, wherein the specific implementation of the silk screening or spraying oil ink on the chip, the photoelectric converter and the light emitter comprises: silk screening or spraying at least one layer of conventional oil ink on the chip, the photoelectric converter and the light emitter; and opening pores at a partial position of the at least one layer of conventional oil ink.

With reference to the second aspect or the first possible implementation, in an eighth possible implementation, the covering layer being covered on the chip, the photoelectric converter and the light emitter comprises: silk screening or heat transfer printing oil ink on a transparent or semi-transparent thin film, and the light transmittance of the thin film and the oil ink to the light emitted by the light emitter is greater than or equal to 30%; or opening pores at a partial position of a colored thin film so that the light transmittance of the thin film at the pore portion to the light emitted by the light emitter is greater than or equal to 30%; and the thin film being covered on the chip, the photoelectric converter and the light emitter.

With reference to the second aspect or the first possible implementation, in a ninth possible implementation, the fixing the chip on the circuit board comprises: soldering the chip on the circuit board through solder paste or silver paste using plane soldering technology, and the thickness of the solder paste or silver paste between the chip and the circuit board ranging between 20 μm and 120 μm.

With reference to the second aspect or any of the above possible implementations, in a tenth possible implementation, the biological detection device further comprises a ring. And the processing method further comprises: soldering the ring on the circuit board through solder paste or silver paste using plane soldering technology, and the thickness of the solder paste or silver paste between the ring and the circuit board ranging between 40 μm and 140 μm; and the ring surrounding the chip, the light emitter and the photoelectric converter.

The biological detection device processed by the processing method of the present disclosure integrates an optical module for performing detection on a biological body and a device for fingerprint recognition together, such that the biological detection device not only recognizes a fingerprint, but also detects other features of the biological body, that is, one detection device is capable of completing multiple functions, thereby improving portability for a user and flexibility of using the biological detection device, and meanwhile preventing fingerprint recognition from being cracked by prosthesis.

BRIEF DESCRIPTION OF DRAWINGS

To describe the technical solutions in the present disclosure more clearly, the following briefly describes the accompanying drawings required for describing the embodiments of the present disclosure. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by persons of ordinary skill in the art based on the embodiments of the present disclosure without creative efforts shall fall within the protection scope of the present disclosure.

Figure 1:
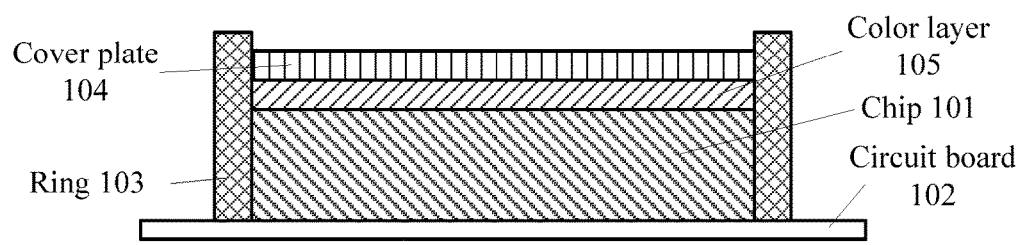
FIG. 1 is a structural schematic view of a prior fingerprint recognition device.

In order to make a better understanding of the biological detection device of the embodiments of the present disclosure, the following firstly introduces the structure of a prior fingerprint recognition device with reference to FIG. 1.

As shown in FIG. 1, a prior fingerprint recognition device comprises a fingerprint recognition chip 101, a circuit board 102, a ring 103, a cover plate 104 and a color layer 105. The fingerprint recognition chip 101 is soldered on the circuit board 102. The fingerprint recognition chip 101 is covered with the color layer 105, and the color of the color layer 105 matches with the appearance color of a device installed with the fingerprint recognition device. The color layer 105 is covered with the cover plate 104 to protect the color layer 105 and the fingerprint recognition chip 101. The fingerprint recognition chip 101, the color layer 105 and the cover plate 104 are surrounded with the ring 103. The ring 103 is also soldered on the circuit board 102. And the cover plate 104 may also be replaced with a hardness layer.

It can be seen from the structure of the above prior fingerprint recognition device that the prior fingerprint recognition device is used for fingerprint recognition, has single functions, and is easily cracked by prosthesis.

Some prior optical modules can be used for detecting a variety of features of a biological body. If a user not only needs to recognize a fingerprint, but also to detect features, a fingerprint recognition device and a detection device installed with an optical module are required to be carried respectively, which results in inconvenient carrying and inflexible usage. Therefore, the present disclosure provides that a fingerprint recognition device is integrated with an optical module for detection to form an integral biological detection device.

The following introduces a biological detection device and a processing method of the biological detection device of embodiments of the present disclosure in details with reference to FIGS. 2 to 8.

Figure 2:
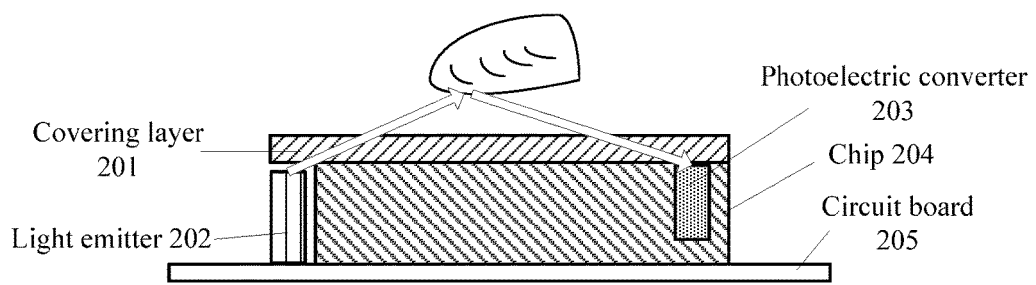
FIG. 2 is a structural schematic sectional view of an embodiment biological detection device of the present disclosure.

FIG. 2 illustrates a structural schematic sectional view of an embodiment biological detection device of the present disclosure. As shown in FIG. 2, the biological detection device comprises a covering layer 201, a light emitter 202, a photoelectric converter 203, a chip 204, and a circuit board 205.

The covering layer 201 is capable of being passed through by light emitted by the light emitter. In addition, the covering layer can also provide an appearance color of the biological detection device, i.e., the appearance color displayed by the biological detection device to a user eventually is mainly determined by the covering layer 201. The covering layer 201 can absorb light at some certain wavelengths and enable light at some specific wavelengths to pass through so as to selectively transmit the light emitted by the light emitter, thereby ensuring a certain transmittance over useful light and a certain absorption capacity over useless light.

In most cases, the appearance color provided by the covering layer 201 matches with the appearance color of the device installed by the biological detection device.

When the biological detection device is processed, the covering layer 201 can be covered on the chip 204, the photoelectric converter 203, and the light emitter 202.

The light emitter 202 is used for providing light source, can be a single packaging body or a plurality of packaging bodies, and can contain one or more light-emitting wavelength chip. The wavelength of light emitted by the light emitter 202 ranges between 390 nanometers (nm) to 1300 nm. At present stage, the light emitter 202 is mainly used for emitting light at a wavelength of 525 nm, 625 nm, 720 nm, 840 nm or 950 nm.

When the light emitted by the light emitter 202 passes through the covering layer 201 covered thereon, and irradiates an object to be detected (a finger as illustrated in FIG. 2), the light is reflected through the covering layer 201 covered on the photoelectric converter 203 again, and reaches the photoelectric converter 203 finally.

When the biological detection device is processed, it may directly fix the light emitter 202 on the circuit board 205, or it may integrate the light emitter 202 on the chip 204 firstly, and then fix the chip 204 on the circuit board 205. When the light emitter 202 is directly fixed on the circuit board 205, it needs to strictly control the deflection angle and flatness in the time of soldering the light emitter 202. Generally speaking, the rotation angle at the horizontal plane is smaller than 2°, and the height difference of two terminals in a vertical direction is smaller than 10 μm.

The photoelectric converter 203 is used for receiving light which is emitted by the light emitter 202 and reaches the photoelectric converter 203 after a series of propagation processes (an arrow as illustrated in FIG. 2 is the propagation processes of the light), and performing photoelectric converting on the received light so as to obtain an electrical signal.

When the biological detection device is processed, the photoelectric converter 203 is integrated in the chip 204, and then the chip 204 is fixed on the circuit board 205. And it is required to ensure a certain distance between the light emitter and the photoelectric converter, for example, the distance between the light emitter and the photoelectric converter is controlled within 2 mm to 9 mm.

The chip 204, which contains a series of circuits, is used for fingerprint recognition and other detection of an object to be detected according to an electric signal converted by the photoelectric converter 203, for example, detecting heart rate of the object to be detected, performing living body detection, press detection, or other detection on the object to be detected according to the electric signal. That is, the whole biological detection device can realize fingerprint recognition and other detection functions. The chip 204 can execute fingerprint recognition and other detection functions simultaneously, and can also execute fingerprint recognition and other detection functions respectively.

When the biological detection device is processed, the chip 240 is fixed on the circuit board 205.

In the embodiment of the present disclosure, the photoelectric converter 203 is integrated on the chip 204, and this is merely an example. And in fact, the photoelectric converter may not be integrated on the chip 204 as well, and the present disclosure does not limit to this.

The circuit board 205 is used for bearing the chip 204, the photoelectric converter 203 and the light emitter 202, and meanwhile, providing a communication channel and power supply for the chip 204, the photoelectric converter 203 and the light emitter 202. That is, the chip 204, the photoelectric converter 203 and the light emitter 202 are directly or indirectly fixed on the circuit board 205.

The biological detection device of the present disclosure integrates an optical module for performing detection on a biological body and a device for fingerprint recognition together, such that the biological detection device not only recognizes a fingerprint, but also detects other features of the biological body, that is, one detection device is capable of completing multiple functions, thereby enhancing portability for a user and flexibility of using the biological detection device, and meanwhile preventing fingerprint recognition from being cracked by prosthesis.

In the embodiment of the present disclosure, optionally, the covering layer may be a color layer having hardness, and may also comprise a color layer and a protection layer, and the protection layer has hardness. The adhesive force between the protection layer and the color layer is greater than and equal to 3 B in the standard "ASTM D3359-1997 Paint Adhesion Test" of American Society for Testing and Materials (American Society for Testing and Materials, ASTM for short) after boiling water and cross hatch cutter test. The light transmittance of the color layer and the protection layer to the light emitted by the light emitter shall be greater than or equal to 30% so that it can ensure the light emitted by the light emitter 202 passes through the covering layer 201. At this time, the photoelectric converter 203 mainly receives the light emitted by the light emitter 202, irradiating the object to be detected through part of the color layer and the protection layer of which the light transmittance to the light emitted by the light emitter 202 is greater than or equal to 30% on the color layer, and then reflected through part of the color layer of which the light transmittance to the light emitted by the light emitter 202 is greater than or equal to 30% on the protection layer and the color layer. Optionally, the protection layer may be a cover plate or a hardness layer, etc.

In the embodiment of the present disclosure, the covering layer may also comprise a special thin film such as a plated anti-reflection film, a filtering membrane, an infrared film or a one-way membrane, etc. The thin film may be a transparent or semi-transparent thin film sprayed with IR oil ink, and may also be an ordinary colored thin film.

When the covering layer comprises a transparent or semi-transparent thin film, a processing method thereof is: silk screening or heat transfer printing a special oil ink passed through by infrared light on the thin film, such as IR black oil ink and IR blue oil ink. The thickness of the oil ink is controlled within 5 μm to 30 μm, and the light transmittance should be greater than or equal to 30%, and then the thin film is pasted on the chip. Of course, the thin film can also be pasted on the chip firstly, and then the special oil ink is silk screened or heat transfer printed on the thin film.

When the covering layer comprises a colored thin film, it is further required to open pores on the thin film or make a particular pattern to realize light transmission. The diameter of the pores is within 5 μm to 50 μm, the pore distance ranges between 10 μm and 100 μm, and the light transmittance should be greater than or equal to 30%.

The covering layer may also comprise a thin film of a special material. For example, when the light emitter emits infrared light, a thin film made of a material capable of being passed through by the infrared light can be used, for example, an acrylic material.

When the covering layer comprises the thin film, the surface hardness of the thin film is generally further required to be enhanced so as to protect the thin film.

In the embodiment of the present disclosure, optionally, it is also possible to cover a material of which the light transmittance to the light emitted by the light emitter is greater than or equal to 30% and having both hardness and color, on the chip, the light emitter and the photoelectric converter as a covering layer.

Figure 3:
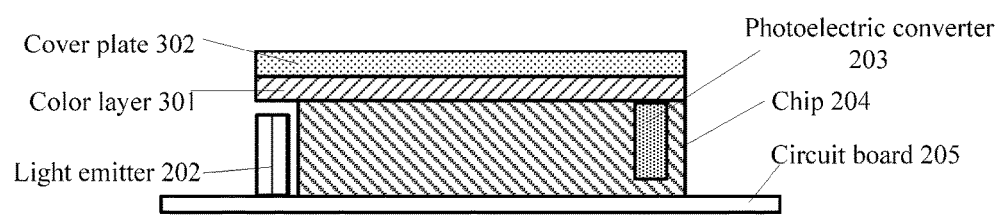
FIG. 3 is a structural schematic sectional view of another embodiment biological detection device of the present disclosure.

FIG. 3 is a structural schematic sectional view of another embodiment biological detection device of the present disclosure. The same reference signs in FIG. 3 as those in FIG. 2 represent the same meanings, and will not be explained herein. As shown in FIG. 3, the light emitter 202 is directly fixed on the circuit board 205, and the protection layer is a cover plate 302, i.e., the covering layer comprises a color layer 301 and the cover plate 302.

The color layer 301 is used for providing the appearance color of the biological detection device, i.e., the appearance color displayed by the biological detection device to a user eventually is mainly determined by the color layer 301. The color layer 301 can absorb light at some certain wavelengths and enable light at some specific wavelengths to pass through so as to selectively transmit light emitted by the light emitter, thereby ensuring a certain transmittance over useful light and a certain absorption capacity over useless light. In most cases, the appearance color provided by the color layer 301 matches with the appearance color of a device installed by the biological detection device.

In general, the light transmittance of all or part of the color layer 301 to the light emitted by the light emitter 202 should be greater than or equal to 30%, the thickness of the color layer 301 ranges between 5 nm to 50 μm, and the permittivity thereof is greater than 2.

The cover plate 302 is in a transparent semiconductor material and an opaque material, which generally may be selected from glass, sapphire, ceramic, acrylic or plastic cement, etc. It would be best that the light transmittance of the cover plate 302 to the light emitted by the light emitter 202 be greater than or equal to 30%.

In the embodiment of the present disclosure, the color layer 301 is adhered on the cover plate 302, and the color layer 301 is connected on the chip 204, the photoelectric converter 203, and the light emitter 202 through glue or a glutinous thin film. The thickness of the glue or thin film ranges between 5 μm and 150 μm, the permittivity of the glue or thin film is within 1 to 10, and the light transmittance of the glue or thin film to the light emitted by the light emitter may be greater than or equal to 90%. And the glue or thin film possesses good physical and chemical stability, adhesive strength, extremely small thermal expansion coefficient as well as water absorption. In most cases, the top and the surroundings of the light emitter 202 are filled with sufficient glue to reduce the falling off of the color layer and deformation of the cover plate.

When the covering layer is covered on the chip 204 and the light emitter 202, it may be that the color layer 301 clings close to the surface of the chip 204, or may also be that the cover plate 302 clings close to the surface of the chip 204. In addition, the covering layer in the embodiment of the present disclosure may also be connected with the chip and the light emitter in other manners, and the present disclosure does not limit to this.

It should be understood that in the structural schematic sectional view as shown in FIG. 3, there is a gap between the light emitter 202 and the chip 204 and the color layer 301, which is merely to better reflect that the light emitter 202 is not fixed on the chip 204, but directly fixed on the circuit board 205. The present disclosure does not limit to whether there is a gap between the light emitter 202 and the chip 204 and the color layer 301.

Figure 4:
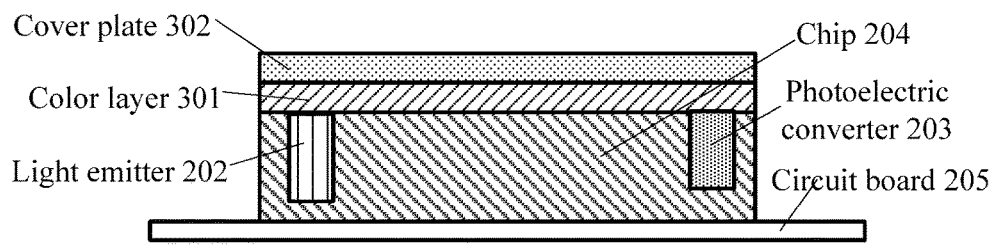
FIG. 4 is a structural schematic sectional view of yet another embodiment biological detection device of the present disclosure.

FIG. 4 is a structural schematic sectional view of yet another embodiment biological detection device of the present disclosure. The same reference signs in FIG. 4 as those in FIG. 3 represent the same meanings, and will not be explained herein. The difference between the biological detection device as illustrated in FIG. 4 and that in FIG. 3 lies in both the light emitter 202 and the photoelectric converter 203 are integrated on the chip 204 so as to be fixed on the circuit board 205 indirectly.

Figure 5:
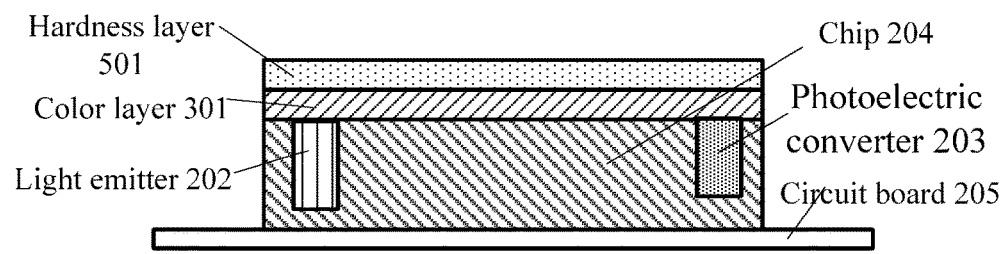
FIG. 5 is a structural schematic sectional view of yet another embodiment biological detection device of the present disclosure.

FIG. 5 is a structural schematic sectional view of yet another embodiment biological detection device of the present disclosure. The same reference signs in FIG. 5 as those in FIG. 4 represent the same meanings, and will not be explained herein. The difference between the biological detection device as illustrated in FIG. 5 and that in FIG. 4 lies in the protection layer is a hardness layer, i.e., the covering layer comprises the color layer 301 and a hardness layer 501.

The thickness of the hardness layer 501 ranges between 2 μm and 25 μm, the Mohs hardness is greater than or equal to 3, the permittivity is within 1 to 10, and the light transmittance to the light emitted by the light emitter is greater than or equal to 30%.

At this time, the color layer 301 is attached to the chip 204 in the manner of spraying. The adhesive force between the color layer 301 and the chip 204 is generally greater than and equal to 3 B in the standard "ASTM D3359-1997 Paint Adhesion Test" of American Society for Testing and Materials (American Society for Testing and Materials, ASTM for short) after boiling water and cross hatch cutter test. The hardness layer 501 is attached to the color layer 301 in the manner of spraying.

When the light emitter is integrated on the chip, the covering layer comprising the hardness layer and the color layer is usually adopted to cover the chip, the photoelectric converter and the light emitter.

In the above embodiment of the present disclosure, the biological detection device further comprises a ring. The ring can be soldered on the circuit board 205 through solder paste or silver paste using plane soldering technology. The thickness of the solder paste or silver paste between the ring and the circuit board 205 ranges between 40 μm and 140 μm. The ring surrounds the chip 401, the light emitter 202 and the photoelectric converter 203.

When the light emitter is directly fixed on the circuit board, glue is usually used between the ring and the light emitter and the photoelectric converter to increase the fixity among the three; and when the light emitter is integrated on the chip and the chip is then fixed on the circuit board, glue is usually used between the ring and the chip to increase the fixity between the two. The permittivity of the glue used is within 1 to 10, and the light transmittance of the glue to the light emitted by the light emitter is greater than or equal to 90%. And meanwhile, the glue used possesses good physical and chemical stability, relatively small thermal expansion coefficient and water absorption.

Figure 6:
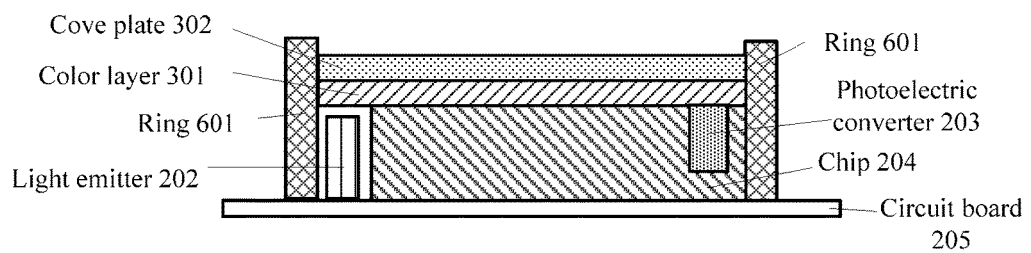
FIG. 6 is a structural schematic sectional view of yet another embodiment biological detection device of the present disclosure.
Figure 7:
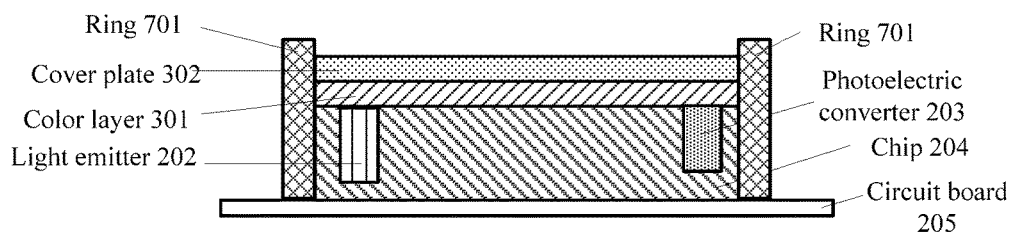
FIG. 7 is a structural schematic sectional view of yet another embodiment biological detection device of the present disclosure.
Figure 8:
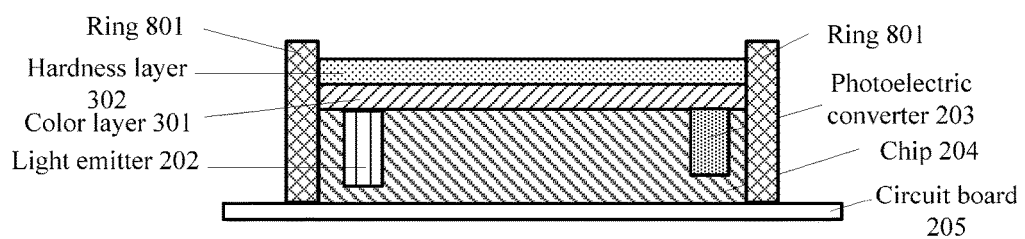
FIG. 8 is a structural schematic sectional view of yet another embodiment biological detection device of the present disclosure.

A sectional view in which the biological detection device as illustrated in FIG. 3 comprises a ring 601 is illustrated in FIG. 6, a sectional view in which the biological detection device as illustrated in FIG. 4 comprises a ring 701 is illustrated in FIG. 7, and a sectional view in which the biological detection device as illustrated in FIG. 5 comprises a ring 801 is illustrated in FIG. 8. The same reference signs in FIGS. 6, 7 and 8 as those in FIGS. 3, 4 and 5 represent the same meanings, and will not be explained herein.

It should be understood that in the structural schematic sectional view as illustrated in FIGS. 6, 7 and 8, there may be or may not be a gap between the ring 601, the ring 701 or the ring 801 and the chip 204, the color layer 301, the cover plate 302 or the hardness layer 501 and/or the light emitter, and the present disclosure does not limit to this.

In the above embodiments of the present disclosure, the light emitter 202 can emit infrared light or emit infrared light and red light at the same time.

When the light emitter 202 emits infrared light, the color layer 301 may comprise one or more layers of IR oil ink, or may comprise at least one layer of IR oil ink and at least one layer of conventional oil ink, but pores should be opened at a partial position of the conventional oil ink such that a majority of the infrared light emitted by the light emitter 202 can pass through from the pore position. When the light emitter 202 emits infrared light and red light, the color layer 301 may comprise one or more layers of conventional oil ink. At this time, pores should be opened at a partial position of the conventional oil ink such that a majority of the infrared light emitted by the light emitter 202 can pass through from the pore position.

The shape of the pores at the partial position of the above conventional oil ink may be made into varieties of patterns according to requirements.

When silk screening or spraying oil ink on the cover plate to generate the color layer, the color layer may be made into the color such as black, white, red, gold, silver, pink, etc. according to the color requirements of the color layer. The following introduces a processing method of generating a color layer on the cover plate, taking an example of processing a black color layer and a white color layer on the cover plate when the light emitter 202 emits infrared light or emits infrared light and red light simultaneously.

When the light emitter 202 emits infrared light, one process of processing a black color layer on the cover plate is: silk screening two layers of extra black IR oil ink on the cover plate. Generally speaking, silk screening the two layers of extra black IR oil ink is directly silk screening or spraying IR black oil ink on the cover plate. The total thickness of the IR black oil ink can be controlled within 5 μm to 18 μm, and the light transmittance is greater than or equal to 30%.

When the light emitter 202 emits infrared light, another process of processing a black color layer on the cover plate is: silk screening one layer of extra black IR oil ink and one layer of conventional black oil ink on the cover plate. Pores are provided at a partial position of the conventional black oil ink to avoid the light emitter 202 and the photoelectric converter 203, the total thickness of the black oil ink can be controlled within 5 μm to 30 μm, and the light transmittance should be greater than and equal to 30%.

When the light emitter 202 emits infrared light and red light, one process of processing a black color layer on the cover plate is: silk screening two layers of conventional oil ink on the cover plate, then opening pores at a partial position of the conventional oil ink to avoid the light emitter 202 and the photoelectric converter 203 so that the pore portion can be passed through by light emitted by the light emitter and the photoelectric converter 203 can receive light.

When the light emitter 202 emits infrared light, one process of processing a white color layer on the cover plate is: silk screening two layers of conventional oil ink plus one layer of gray oil ink on the cover plate. The gray oil ink is a special IR gray oil ink mixed by IR oil ink. The thickness of the white oil ink ranges between 8 μm and 20 μm, and the thickness of the gray oil ink ranges between 4 μm and 10 μm.

When the light emitter 202 emits infrared light, another process of processing a white color layer on the cover plate is: silk screening three layers of white oil ink and one layer of gray oil ink on the cover plate, and then opening pores or engraving varieties of patterns at a partial position of the oil ink to avoid the light emitter 202 and the photoelectric converter 203. The diameter of the pores is within 5 μm to 50 μm, the pore distance ranges between 10 μm and 100 μm, and the size of the pattern depends on the specific requirements. The thickness of the white oil ink is controlled within 12 μm to 30 μm, the thickness of the gray oil ink is controlled within 4 μm to 10 μm, and the light transmittance of the two should be greater than and equal to 30%.

When the light emitter 202 emits infrared light and red light, another process of processing a white color layer on the cover plate is: silk screening three layers or four layers of conventional white oil ink on the cover plate, and then opening pores at a partial position of the conventional white oil ink to avoid the light emitter 202 and the photoelectric converter 203. The avoiding size ranges between 0.2 mm and 1.5 mm, the diameter of the pores is within 5 μm to 50 μm, the pore distance ranges between 10 μm and 100 μm, and the total thickness of the oil ink is within 15 μm to 40 μm.

In the time of silk screening or spraying oil ink on the chip to form the color layer, the color layer can be made into black, white, red, gold, silver, pink, etc. according to color requirements.

When the light emitter 202 emits infrared light, as for processing a black color layer on the chip, a multiple layers of IR oil ink and a hardness layer can be silk screened on the chip, and the specific steps are: directly silk screening or spraying IR black on the chip, and then silk screening the hardness layer on the IR oil ink. The total thickness of the IR black oil ink should be controlled between 10 μm and 80 μm, the thickness of the hardness layer is controlled between 5 μm and 15 μm, and the light transmittance is greater than and equal to 30%.

When the light emitter 202 emits infrared light, as for processing a black color layer on the chip, it is also feasible to directly silk screen or spray black oil ink on the chip, and silk screen a hardness layer on the black oil ink, and then open pores at a partial position to avoid the light emitter 202 and the photoelectric converter 203. The partial avoiding size ranges between 0.2 mm and 1.5 mm, the diameter of the pores is within 5 μm to 50 μm, the pore distance ranges between 10 μm and 100 μm, and the thickness of the black oil ink is within 20 μm to 40 μm.

When the light emitter 202 emits infrared light, as for processing a white color layer on the chip, a process of silk screening conventional oil ink and a hardness layer can be performed on the chip, and the specific steps are: directly silk screening or spraying white oil ink on the chip, and silk screening the hardness layer on the white oil ink, and then performing partial avoiding at the position corresponding to the light emitter and the photoelectric converter to open pores. The thickness of the white oil ink is controlled within 10 μm to 80 μm, and the light transmittance should be greater than or equal to 30%.

When the light emitter 202 emits red light and infrared light, as for processing a black color layer on the chip, a process of silk screening conventional oil ink and a hardness layer can be performed on the chip, and the specific steps are: directly silk screening or spraying black oil ink on the chip, and silk screening the hardness layer on the black oil ink, and then performing partial avoiding at the position corresponding to the light emitter and the photoelectric converter to open pores. The diameter of the pore is within 5 μm to 50 μm. The pore distance ranges between 10 μm and 100 μm, the size of the pattern depends on the specific requirements, the thickness of the black oil ink is controlled between 15 μm and 80 μm, and the light transmittance should be greater than or equal to 30%.

When the light emitter 202 emits red light and infrared light, as for processing a white color layer on the chip, a process of silk screening conventional oil ink and a hardness layer can be performed on the chip, and the specific steps are: directly silk screening or spraying white oil ink on the chip, and silk screening the hardness layer on the white oil ink, and then performing partial avoiding at the position corresponding to the light emitter and the photoelectric converter to open pores. The diameter of the pore is within 5 μm and 50 μm. The pore distance ranges between 10 μm and 100 μm, the size of the pattern depends on the specific requirements, the thickness of the white oil ink is controlled between 10 μm and 80 μm, and the light transmittance should be greater than or equal to 30%.

In the several embodiments provided in the present application, it should be understood that the disclosed apparatus and method may be implemented in other manners. For example, the described apparatus embodiment is merely exemplary.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A biological detection device, comprising: a chip, a light emitter, a circuit board and a covering layer;
    wherein the chip comprises a photoelectric converter, the covering layer is covered on the chip, the photoelectric converter and the light emitter;
    the covering layer is passed through by light emitted by the light emitter;
    the photoelectric converter receives light reflected by an object to be detected through the covering layer, wherein the light is emitted by the light emitter and irradiates the object to be detected through the covering layer;
    the photoelectric converter performs photoelectric converting on the reflected light to obtain an electrical signal;
    the chip detects the object to be detected according to the electrical signal; and
    the circuit board provides a communication channel and power supply for the chip, the light emitter and the photoelectric converter;
    wherein the light emitter is at least used for emitting infrared light, and the covering layer comprises a protection layer and a color layer;
    wherein the color layer comprises at least one layer of infrared ray (IR) oil ink.

2. The biological detection device according to claim 1, wherein the light emitter is integrated on the chip.

3. The biological detection device according to claim 2, wherein the covering layer comprises a thin film, and light transmittance of all or part of the thin film to the light emitted by the light emitter is greater than or equal to 30%.

4. The biological detection device according to claim 1, wherein adhesive force between the protection layer and the color layer is greater than or equal to 3 B;
    light transmittance of the protection layer to the light emitted by the light emitter is greater than or equal to 30%, used for protecting the color layer; and
    light transmittance of all or part of the color layer to the light emitted by the light emitter is greater than or equal to 30%, thickness of the color layer ranges between 5 nm and 50 μm, permittivity of the color layer is greater than 2, and the color layer is used for providing an appearance color of the biological detection device.

5. The biological detection device according to claim 4, wherein the protection layer is a cover plate, and a material of the cover plate is glass, sapphire, ceramic, acrylic or plastic cement; and
    the covering layer is connected on the chip, the photoelectric converter and the light emitter through glue or a thin film, thickness of the glue or thin film ranges between 5 μm and 150 μm, permittivity of the glue or thin film is within 1 to 10, and light transmittance of the glue or thin film is greater than and equal to 90%.

6. The biological detection device according to claim 4, wherein the protection layer is a hardness layer, thickness of the hardness layer ranges between 2 μm and 25 μm, a Mohs hardness of the hardness layer is greater than or equal to 3, and permittivity of the hardness layer is within 1 to 10; and
    the color layer is attached to the chip, the photoelectric converter and the light emitter in a manner of spraying, adhesive force between the color layer and the chip, the photoelectric converter and the light emitter is greater than or equal to 3 B, and the hardness layer is attached to the color layer in a manner of spraying.

7. The biological detection device according to claim 1, wherein
    the color layer further comprises at least one layer of conventional oil ink, and pores are opened at a partial position of the at least one layer of conventional oil ink.

8. The biological detection device according to claim 1, wherein the light emitter is used for emitting infrared light and red light; and
    the color layer comprises at least one layer of conventional oil ink, and pores are opened at a partial position of the at least one layer of conventional oil ink.

9. The biological detection device according to claim 1, wherein the chip is soldered on the circuit board via solder paste or silver paste using plane soldering technology, and thickness of the solder paste or silver paste between the chip and the circuit board ranges between 20 μm and 120 μm.

10. The biological detection device according to claim 1, wherein the biological detection device further comprises a ring soldered on the circuit board via solder paste or silver paste using plane soldering technology, and thickness of the solder paste or silver paste between the ring and the circuit board ranges between 40 μm and 140 μm; and the ring surrounds the chip, the light emitter and the photoelectric converter.

11. The biological detection device according to claim 1, wherein the chip performs at least one of fingerprint detection, heart rate detection, pressure detection, key press detection, blood oxygen detection, blood pressure detection and living body detection on the object to be detected according to the electrical signal.

12. A processing method of a biological detection device, wherein the biological detection device is the biological detection device of claim 1; and
the processing method comprises:
integrating the photoelectric converter on the chip;
fixing the chip on the circuit board; and
covering the covering layer on the chip, the photoelectric converter and the light emitter.

13. The processing method according to claim 12, wherein the processing method further comprises integrating the light emitter on the chip.

14. The processing method according to claim 13, wherein covering the covering layer on the chip, the photoelectric converter and the light emitter comprises:
silk screening or spraying oil ink on the chip, the photoelectric converter and the light emitter, the oil ink forming a color layer, wherein an adhesive force between the color layer and the chip, the photoelectric converter and the light emitter is greater than or equal to 3 B; light transmittance of all or part of the color layer to the light emitted by the light emitter is greater than or equal to 30%, thickness of the color layer ranges between 5 nm and 50 µm, permittivity of the color layer is greater than 2; and
silk screening a hardness layer on the color layer, wherein an adhesive force between the color layer and the hardness layer is greater than or equal to 3 B; thickness of the hardness layer ranges between 2 µm and 25 µm, Mohs hardness of the hardness layer is greater than or equal to 3, and permittivity of the hardness layer is within 1 to 10.

15. The processing method according to claim 14, wherein the light emitter is used for emitting infrared light,
wherein the silk screening or spraying oil ink on the chip, the photoelectric converter and the light emitter comprises:
silk screening or spraying at least one layer of infrared ray (IR) oil ink on the chip, the photoelectric converter and the light emitter; or
silk screening or spraying at least one layer of infrared ray (IR) oil ink and at least one layer of conventional oil ink on the chip, the photoelectric converter and the light emitter, and opening pores at a partial position of the at least one layer of conventional oil ink.

16. The processing method according to claim 14, wherein the light emitter is used for emitting infrared light and red light,
wherein the silk screening or spraying oil ink on the chip, the photoelectric converter and the light emitter comprises:
silk screening or spraying at least one layer of conventional oil ink on the chip, the photoelectric converter and the light emitter; and
opening pores at a partial position of the at least one layer of conventional oil ink.

17. The processing method according to claim 13, wherein covering the covering layer on the chip, the photoelectric converter and the light emitter comprises:
silk screening or heat transfer printing oil ink on a transparent or semi-transparent thin film, and light transmittance of the thin film and the oil ink to the light emitted by the light emitter being greater than or equal to 30%; or opening pores at a partial position of a colored thin film so that the light transmittance of the thin film at the pore portion to the light emitted by the light emitter is greater than or equal to 30%; and
covering the thin film on the chip, the photoelectric converter and the light emitter.

18. The processing method according to claim 12, wherein covering the covering layer on the chip, the photoelectric converter and the light emitter comprises:
silk screening or spraying oil ink on a cover plate, the oil ink forming a color layer, the color layer and the cover plate forming the covering layer, wherein adhesive force between the color layer and the cover plate is greater than or equal to 3 B; a material of the cover plate is glass, sapphire, ceramic, acrylic or plastic cement; light transmittance of the cover plate to the light emitted by the light emitter is greater than or equal to 30%; light transmittance of all or part of the color layer to the light emitted by the light emitter is greater than or equal to 30%, thickness of the color layer ranges between 5 nm and 50 µm, and permittivity of the color layer is greater than 2; and
connecting the covering layer on the chip, the photoelectric converter and the light emitter through glue or a thin film, wherein thickness of the glue ranges between 5 µm and 150 µm, permittivity of the glue is within 1 to 10, and light transmittance of the glue is greater than and equal to 90%.

19. The processing method according to claim 18, wherein the light emitter is used for emitting infrared light,
wherein the silk screening or spraying oil ink on the cover plate comprises:
silk screening or spraying at least one layer of infrared ray (IR) oil ink on the cover plate; or
silk screening or spraying at least one layer of infrared ray (IR) oil ink and at least one layer of conventional oil ink on the cover plate, and opening pores at a partial position of the at least one layer of conventional oil ink.

20. The processing method according to claim 18, wherein the light emitter is used for emitting infrared light and red light,
wherein the silk screening or spraying oil ink on the cover plate comprises:
silk screening or spraying at least one layer of conventional oil ink on the cover plate; and
opening pores at a partial position of the at least one layer of conventional oil ink.

* * * * *